US010429450B2

(12) United States Patent
Lee et al.

(10) Patent No.: US 10,429,450 B2
(45) Date of Patent: Oct. 1, 2019

(54) BATTERY SENSING METHOD AND APPARATUS

(71) Applicant: NAVITAS SOLUTIONS, Hillsborough, NJ (US)

(72) Inventors: Jaesik Lee, Basking Ridge, NJ (US); Junho Moon, Hillsborough, NJ (US); Inseop Lee, Pittstown, NJ (US)

(73) Assignee: Navitas Solutions, Inc., Hillsborough, NY (US)

( * ) Notice: Subject to any disclaimer, the term of this patent is extended or adjusted under 35 U.S.C. 154(b) by 308 days.

(21) Appl. No.: 15/313,354

(22) PCT Filed: May 21, 2015

(86) PCT No.: PCT/US2015/031953
§ 371 (c)(1),
(2) Date: Nov. 22, 2016

(87) PCT Pub. No.: WO2015/179629
PCT Pub. Date: Nov. 26, 2015

(65) Prior Publication Data
US 2017/0184682 A1    Jun. 29, 2017

Related U.S. Application Data

(60) Provisional application No. 62/001,746, filed on May 22, 2014.

(51) Int. Cl.
*G01R 31/36* (2019.01)
*H01M 10/48* (2006.01)
(Continued)

(52) U.S. Cl.
CPC .......... *G01R 31/396* (2019.01); *B60L 3/0046* (2013.01); *B60L 3/0092* (2013.01); *B60L 58/22* (2019.02); *G01R 31/389* (2019.01); *G01R 35/00* (2013.01); *H01M 10/482* (2013.01); *H01M 10/486* (2013.01); *H02J 7/00* (2013.01); *H02J 7/0021* (2013.01); *B60L 2240/545* (2013.01); *B60L 2240/547* (2013.01);
(Continued)

(58) Field of Classification Search
None
See application file for complete search history.

(56) References Cited

U.S. PATENT DOCUMENTS

| 8,949,056 | B2 * | 2/2015 | Yang | G01R 31/362 |
| | | | | 324/433 |
| 10,101,404 | B2 * | 10/2018 | Suzuki | G01R 31/396 |

(Continued)

OTHER PUBLICATIONS

International Search Report and Written Opinion for PCT/US2015/031953 dated Aug. 27, 2015.

*Primary Examiner* — Jermele M Hollington
(74) *Attorney, Agent, or Firm* — Fox Rothschild LLP; Robert J. Sacco; Carol E. Thorstad-Forsyth

(57) ABSTRACT

A method and apparatus is provided the battery sensor for a large-scale battery system. More specifically, the present disclosure relates to the architecture and measurement scheme for a high-accuracy battery voltage sensor based on a calibration scheme. The present disclosure also related to the architecture and measurement method for a cell-level current sensor to effectively and reliably manage a battery pack.

22 Claims, 9 Drawing Sheets

(51) Int. Cl.
*G01R 35/00* (2006.01)
*G01R 31/396* (2019.01)
*G01R 31/389* (2019.01)
*H02J 7/00* (2006.01)
*B60L 3/00* (2019.01)
*B60L 58/22* (2019.01)
G01R 19/257 (2006.01)
G01R 15/20 (2006.01)

(52) U.S. Cl.
CPC ....... *B60L 2240/549* (2013.01); *G01R 15/202* (2013.01); *G01R 19/257* (2013.01); *H01M 2220/20* (2013.01); *Y02T 10/7005* (2013.01); *Y02T 10/7055* (2013.01); *Y02T 10/7061* (2013.01)

(56) References Cited

U.S. PATENT DOCUMENTS

| | | |
|---|---|---|
| 2011/0004427 A1 | 1/2011 | Gorbold et al. |
| 2011/0121784 A1 | 5/2011 | Yun et al. |
| 2012/0013366 A1 | 1/2012 | Li et al. |
| 2012/0158338 A1 | 6/2012 | Yang et al. |
| 2012/0194133 A1 | 8/2012 | Posamentier et al. |
| 2012/0326725 A1* | 12/2012 | Sugeno .............. G01R 31/3648 324/429 |
| 2017/0030976 A1* | 2/2017 | Suzuki ................ G01R 31/396 |
| 2017/0057372 A1* | 3/2017 | Loftus ................ G01R 31/396 |

* cited by examiner

BATTERY SENSING METHOD AND APPARATUS

CROSS-REFERENCE TO RELATED APPLICATIONS

This application is a U.S. National Phase Application of International Patent Application No. PCT/US2015/031953, filed on May 21, 2015 which claims the benefit of U.S. Patent Provisional No. 62/001,746, filed on, May 22, 2014, the contents of which are incorporated herein by reference in their entireties.

BACKGROUND OF THE INVENTION

Statement of the Technical Field

The inventive arrangements relate to battery sensors for large-scale battery systems, and more particularly to systems capable of measuring electrical characteristics of large-scale battery systems down to the level of individual cells.

Description of the Related Art

Large scale battery systems are becoming increasingly important in certain applications. For example, such systems are commonly used in hybrid/electric vehicles (xEV) and other types of energy storage systems (ESS). A battery pack used in these applications may have a single pair of output terminals, but internally the pack is commonly comprised of many individual battery cells working together. The number of battery cells and the configuration of cell connection are selected to meet the requirements of a particular battery pack with regard to output voltage and power capacity. The number of cells connected in series determines an output voltage for the battery pack. The number of cells connected in parallel determines the amount of current flow and power capacity of the battery pack.

Proper electric and thermal management of large-scale battery systems (i.e., battery packs) is imperative. Such management is particularly important in systems that consist of many individual battery cells as may be used in hybrid/electric vehicles or energy storage systems. During operation, voltage, current, and temperature differences in the individual battery cells can lead to electrical imbalances from cell to cell. These imbalances are known to decrease pack performance and life time and are therefore to be avoided whenever possible.

SUMMARY OF THE INVENTION

Embodiments of the invention concern a sensing system for a battery pack which includes a plurality of battery cells. The sensing system includes a plurality of single battery cell sensor modules (SCSMs), each for one of the plurality of battery cells in the battery pack. Each SCSM includes an analog switching multiplex, an analog-to-digital converter (ADC), and a signal conditioner. The signal conditioner conditions signals received at the analog switching multiplex and communicates the conditioned signals to the ADC. Also included in each SCSM is a reference voltage generator which generates a plurality of reference voltages which define the scale of the ADC and a calibration engine. The analog switching multiplex is responsive to a control system to select when in a sensing mode one or more of the plurality of battery sensor signal inputs based on a predetermined operation schedule.

The calibration engine provided in each SCSM is configured to determine a drift error associated with the plurality of reference voltages and correct the drift error at the reference voltage generator. In this regard, the reference voltage generator generates top and bottom reference voltages which define the full-scale input range for the ADC. The top and bottom reference voltages are applied to inputs of the signal conditioner when the SCSM is in a calibration mode to generate an output calibration voltage. The calibration engine is configured to determine the drift error value by calculating a difference between a predetermined reference value and a measured value output of the ADC in the calibration mode. According to one aspect, the signal conditioner includes a voltage divider and the calibration engine is configured to automatically use the drift error value to adjust the voltage divider. Further, the calibration engine is configured to automatically adjust the top reference voltage and the bottom reference voltage based on the drift error value which has been determined. The top reference voltage and bottom reference voltage can be adjusted using two separate digital-to-analog converter channels.

The battery sensor signal inputs can include a voltage sense signal, a current sense signal, and a temperature input signal. According to a further aspect, each SCSM can be configured to use one or more of the battery sensor input signals to determine a voltage potential across a shunt resistance. The shunt resistance is advantageously an inherent resistance of a portion of a conductive positive or negative output terminal of a single battery cell of the plurality of battery cells. In this regard, the signal conditioner can include two voltage conditioners which respectively independently condition an input voltage potential at each of two distinct points on one of the positive output terminal or the negative output terminal of each battery cell.

The system can also include a master controller which receives from each of the single battery cell sensor modules a value which specifies the voltage potential across the shunt resistance for each of the battery cells. The master controller is configured to calculate the shunt resistance value for each single battery cell using the value which specifies the voltage potential across the shunt resistance for each battery cell and based on a total battery pack current. The master controller is further configured to periodically determine an individual battery cell current for each individual battery cell after the shunt resistance value of each single battery cell has been determined. It does so by using the shunt resistance value stored for each battery cell, and a periodically measured shunt voltage for each battery cell as measured at each of the single battery cell sensor modules. Accordingly, the master controller can automatically determine a condition of each battery cell based on the battery cell current for each battery.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily appreciate that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The present disclosure relates to the architecture and measurement scheme for a high-accuracy battery voltage sensor based on a calibration scheme. It also concerns an architecture and measurement method for a cell-level current sensor to effectively and reliably manage a battery pack. Moreover, it is related to an architecture and measurement method for a battery sensor to reliably and effectively manage a multi-cell battery module.

According to one aspect, the inventive arrangements concern a single-cell battery sensor. The sensor combines a high-accuracy voltage sensor with a cell-level current sensor, especially suitable for large-scale battery systems. The high-accuracy voltage sensor deploys a calibration technique to compensate a reference voltage drift and device mismatch. Combined with an n-bit ADC, the voltage sensor can achieve high accuracy with wide measurement range. The cell-level current sensor features a shunt-type current measurement technique with low offset drift. The cell-level current sensor can obtain reasonable linearity for high-level pack current. The invented voltage and current sensors are directly mounted on a battery cell to improve measurement accuracy, to reduce the measurement failure probability, and to easily diagnose battery conditions. The single-cell battery sensor is proposed to be used in a multi-cell battery sensor. A multi-cell battery sensor is composed of multiple single-cell voltage sensors and isolated power transfer units, and a unique switching scheme for efficient isolated power transfer technique.

Figure 1:
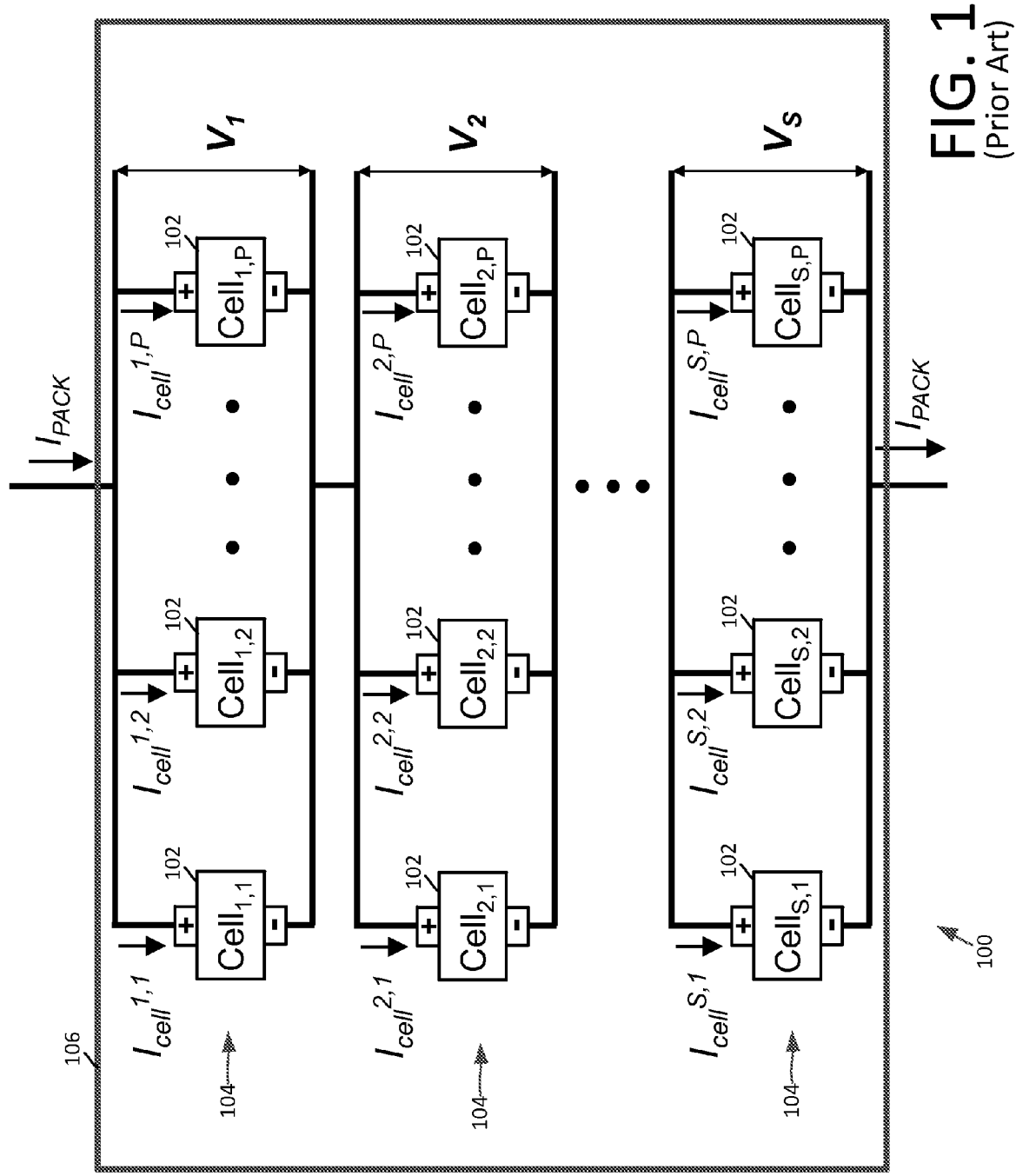
FIG. 1 is a block diagram of a large-scale battery system.

Illustrated in FIG. 1 is a general configuration of a large-scale battery system 100. The number of necessary cells and the configuration of cell connection are selected to meet the requirements of a particular battery pack with regard to output voltage and power capacity. While the number of cells connected in series determines battery system's output voltage, the number of cells connected in parallel determines the amount of current flow and power capacity. Cells 102 are usually connected in parallel first to form a battery module 104 and then connected in series to form the pack 106, as shown in FIG. 1. For convenience the cells 102 in FIG. 1 are shown as being arranged in rows and columns. A battery pack arranged to have P cells in a row and S cells in a column, contains (P*S) cells. The cells in a row ($Cell_{s,p|p=1\ldots P}$) that form a module 104 will each have a same voltage of $V_s$, while the sum of cell voltages in a column is equal to a pack voltage; $\Sigma_{s=1}^{S} V_S = V_{PACK}$. The cells in a row ($Cell_{s,p|p=1\ldots P}$) may have different cell current of $I_{CELL}^{s,p}$, and the sum of cell currents in a row is equal to the pack current; $\Sigma_{p=1}^{P} I_{CELL}^{p} = I_{PACK}$.

Figure 2:
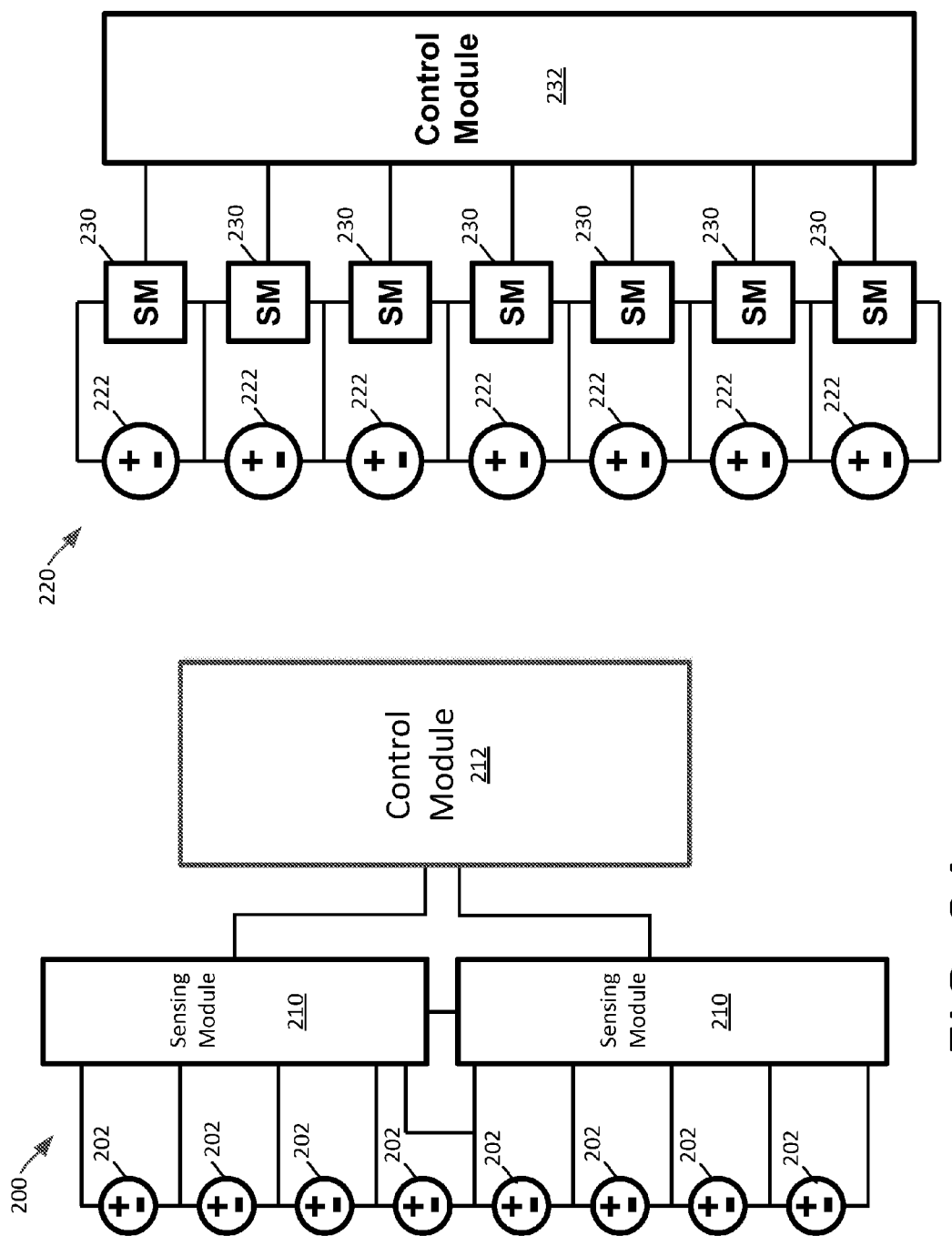
FIGS. 2A-B are commonly used battery sensing architectures.

During the operations of a battery system, voltage, current, and temperature differences among battery cells can lead to electrical imbalances from cell to cell, and reduce the performance and life time of the battery. Cell voltage measurement is straightforward, and its accuracy directly relies on the resolution of an analog-to-digital converter (ADC) that is used for effecting such measurement. Referring now to FIG. 2A, there is shown a block diagram of modular-type sensing architecture 200. Sensing modules (SMs) 210 measure the voltages at various taps in series-connected battery cells 202, and calculate each cell voltage as the voltage difference between two taps. A control module 212 is provided for controlling the operations of the sensing modules. Alternatively, a distribution-type sensing architecture 220 can be used, as shown in FIG. 2B. In a distribution-type sensing architecture, a plurality of sensing modules 230 can directly measure the voltage across each battery cell 222. The sensing modules can be controlled by a control module 230. The cell sensing modules 210 are powered by the respective battery cell 22 being measured. The measurement error in each case mainly depends on the drift of the reference voltages used for the ADC in the sensing module, process and temperature variations, which affect the ADC performance, and/or aging effects. In FIGS. 2A and 2B, the connection between sensing modules and a control module can be wired communications such as serial peripheral interface (SPI), RS232, controller area network (CAN), or wireless communications.

Figure 3:
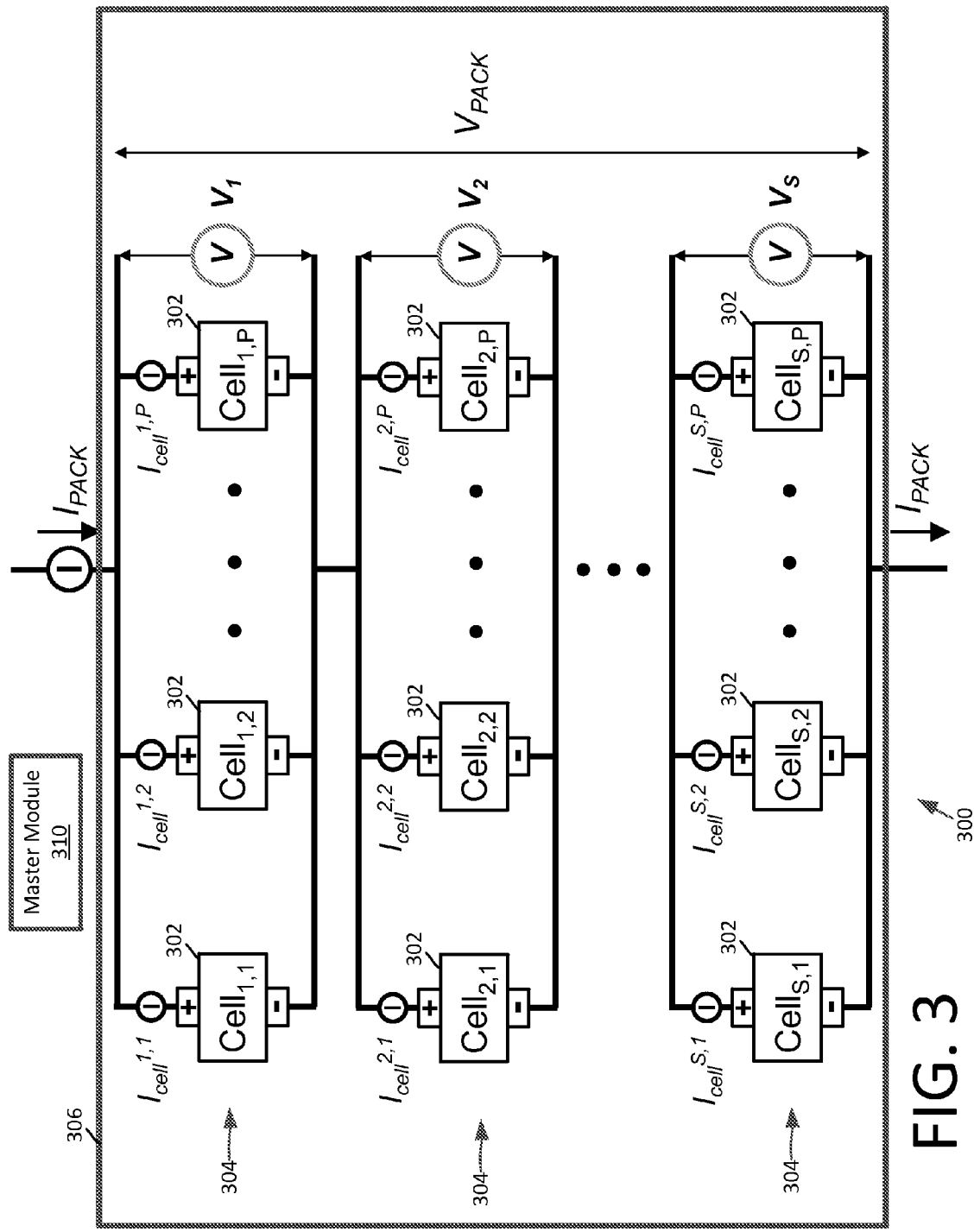
FIG. 3 is a battery pack sensing architecture that is useful for understanding the invention.

A battery sensing architecture is shown in FIG. 3 for use in the context of a large-scale battery system 300. The battery sensor architecture includes current and voltage sensing at each battery cell. Such an arrangement facilitates measurements of current and voltage characteristics at the level of individual battery cells 302 and offers improvements over conventional battery monitoring systems.

As shown in FIG. 3, battery cells 302 are connected in parallel to form battery modules 304. For convenience in understanding the invention, these parallel connected battery cells comprising each module are illustrated to be disposed in a row. The battery modules are then connected in series to form the battery pack 306. As an aid to understanding the invention, the battery cells comprising each module are shown as being aligned in columns with battery cells of adjacent modules. According to one aspect of the inventive arrangements, a cell-level voltage and current sensor is integrated into a sensor integrated circuit (IC). Each sensor IC is integrated into a circuit board to form a single cell sensing module (SCSM). One such sensing module is then directly mounted at or on each individual battery cell 302.

FIG. 3 illustrates a voltage and current sensor implementation on an S-series, P-parallel battery pack, which corresponds to a battery size of S*P. The P parallel-connected cells can facilitate measurement of each cell's voltage and individual cell current at the same time. Theoretically, all the battery cells in a row associated with a module 304 should have the same voltage since they are connected in parallel. In actual practice, the voltages measured by each SCSM will vary to some extent due to quantitative variation or dispersion. These variations are mainly due to reference voltage drift or ADC's performance deviation. Therefore, a host controller or master module 310 will be able to calculate a more accurate voltage $V_s$ for the cells 302 comprising a particular module 304 if the value is obtained by applying a statistical function or estimation based on the plurality of measured voltages obtained for the battery cells in a row. The application of such statistical function or estimation method can help remove voltage measurement errors.

Theoretically the pack current ($I_{PACK}$) show in FIG. 3 is evenly divided into each of the separate battery cells in a row. This assumption is usually reasonably accurate when the battery pack is first assembled, but over time there can be more current in one cell than others. Such unbalanced cell current flow sometimes represents cell performance degradation or hidden trouble spots due to aging or defects. Therefore, it is important to measure the current flowing through each of the individual battery cells 302 in a battery pack 306. Such information can advantageously provide the triggering means for identifying when an aging or defective battery cell should be replaced.

Figure 4:
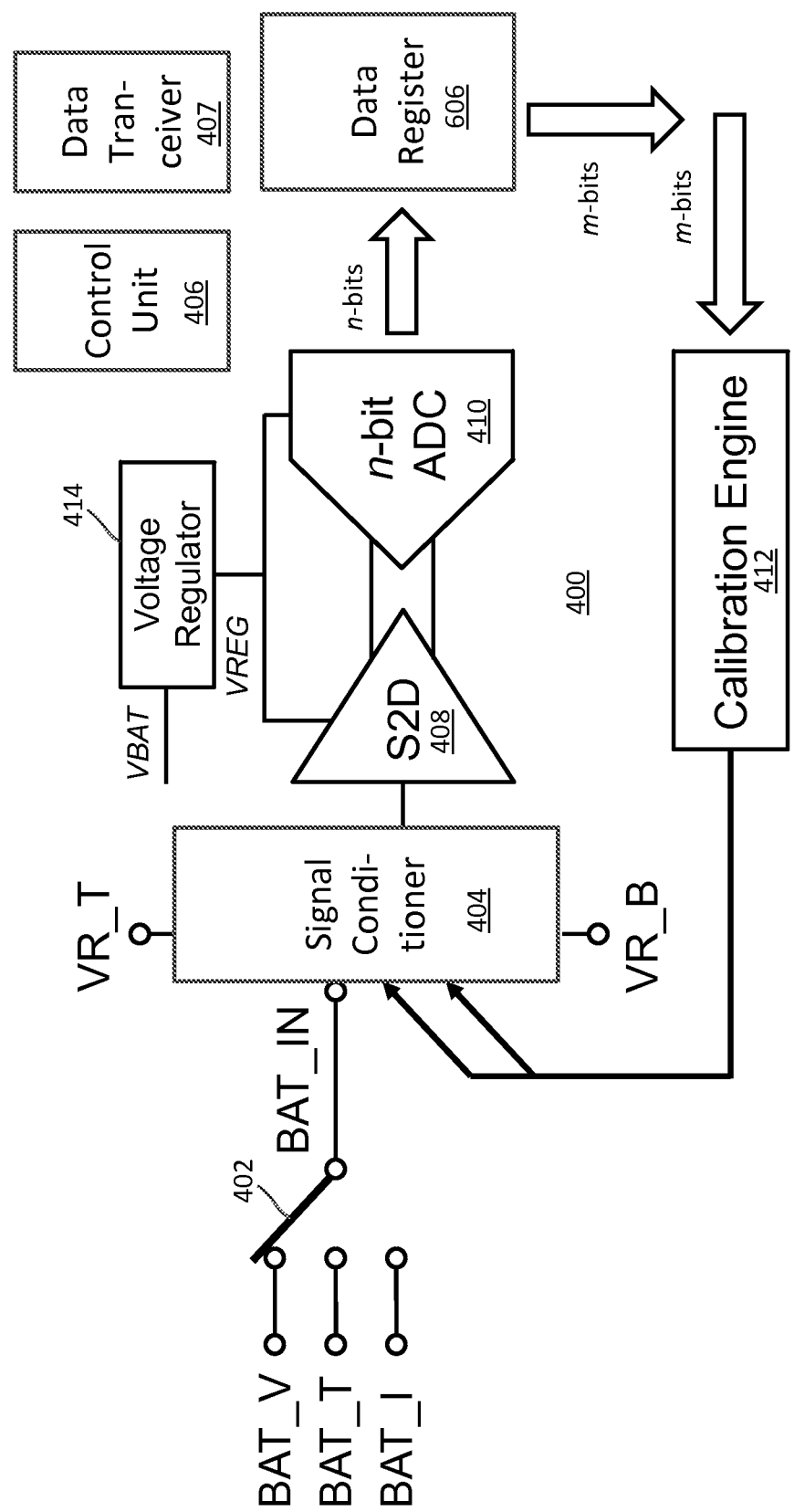
FIG. 4 is a single cell sensor architecture that is useful for understanding the invention.

Referring now to FIG. 4, there is shown an exemplary SCSM 400 that is suitable for a distribution-type sensing architecture 220, as shown in FIG. 2B. The input stage of the SCSM has multiple input terminals such as BAT_V, BAT_T, and BAT_I corresponding to certain battery parameters which are used to estimate the condition and status of a battery cell. For example, the measured battery parameters can include battery terminal voltage (BAT_V), battery body temperature (BAT_T), and/or cell-level battery current (BAT_I). Each of these terminals can be electrically accessed or selected by means of a switch 402. The SCSM 400 can also include a signal conditioner 404, a single-to-differential (S2D) converter 408, an n-bit ADC 410 and a calibration engine 412.

A signal conditioner 404 as used in the SCSM is one of the critical components of measurement and calibration. Its pivotal roles are to align the level of cell input voltage to a full-scale range of the ADC, as well as to detect the mismatch of the ADC reference voltage. It can be, for example, a voltage divider that is a series connection of two passive devices to achieve high linearity. The S2D converter is used to reduce the negative effects associated with common mode noise, which can lead to measurement errors. Notably, the calibration engine is advantageously embedded in the SCSM 400 to also minimize measurement errors.

The SCSM 400 is directly powered by a battery cell on which it is mounted. As such, the SCSM uses a voltage regulator 414 such that regulated power is supplied to the ADC in order to enhance power supply rejection ratio (PSRR). A control unit 406 can be provided to control certain operations of the SCSM. The control unit can be a microcontroller, an application specific integrated circuit, or any other type of dedicated hardware component suitable for implementing the control and/or scheduling functions described herein. A data transceiver 407 can also be provided in the SCSM to facilitate communications between the SCSM and a control module 310. The data transceiver can be designed to facilitate wired communications such as serial peripheral interface (SPI), RS232, controller area network (CAN), or wireless communication.

An SCSM 400 as described herein can have four predefined operation modes. The operation modes include (1) power-down, (2) calibration, (3) standby, and (4) active mode. The selection and operation of one or more of these modes can be under the supervision of the control unit 407. In power-down mode, all the functional blocks in the SCSM 400 are turned down to minimize the current draw. The calibration mode (sometimes referred to herein as the built-in self-calibration or BISC mode) is necessary to correct the errors or drifts of reference voltages due to process or temperature variations.

Figure 5:
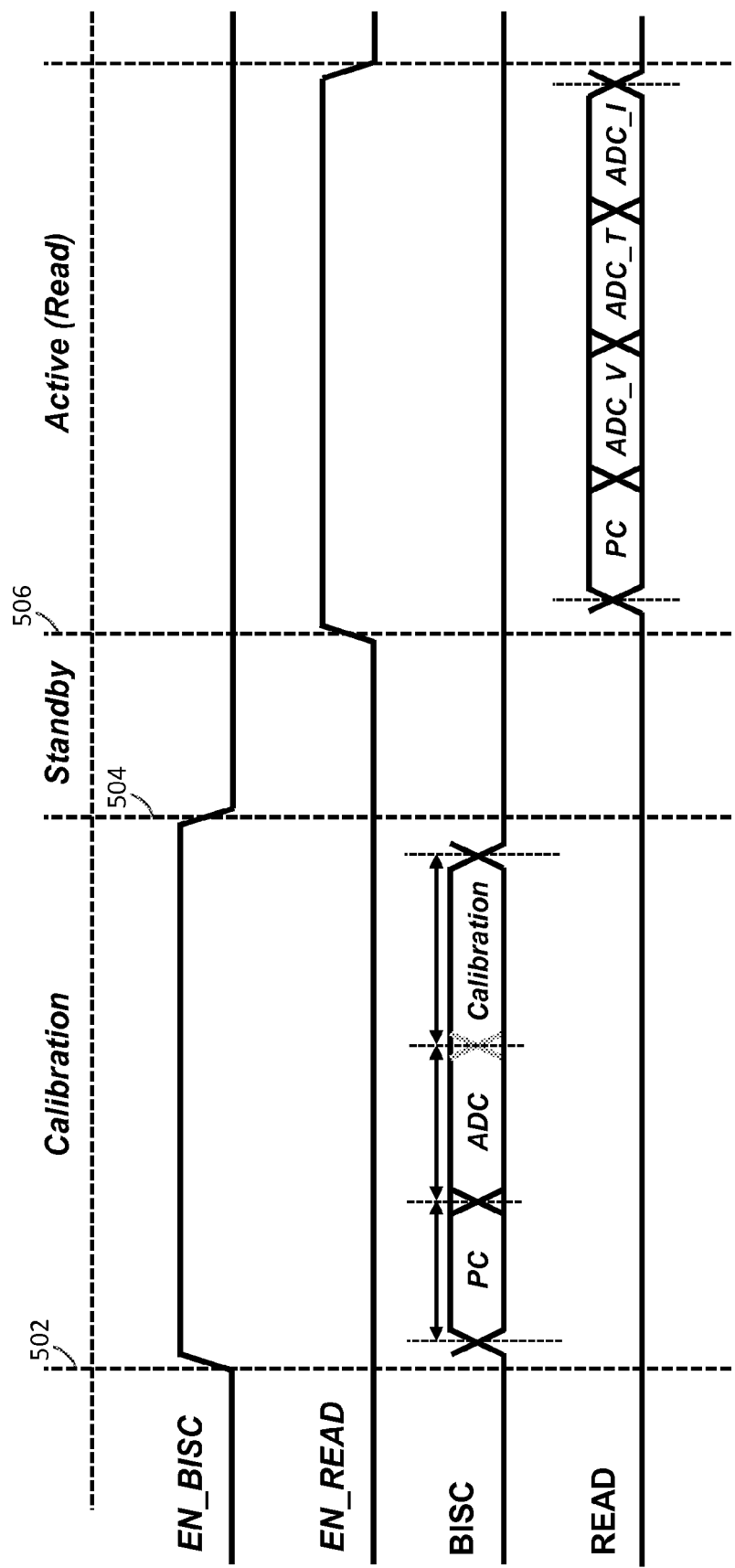
FIG. 5 is a timing diagram for sensor calibration and sensing operations.

As shown in FIG. 5, the BISC mode is initially activated just after power-up transition 502. Further BISC mode activation can occur based on a predetermined schedule or predetermined conditions. An EN_BISC signal controls the sequence of the calibration process. After calibration mode, the SCSM 400 can enter a standby mode at 504, but at some point the sensor enters the active mode at 506 by enabling EN_READ="ON" and starts to measure battery cell conditions. After a power control (PC) period, a single-cell battery sensor selects (e.g. sequentially selects) one of multiple sensor input terminal such as BAT_V, BAT_T, and BAT_I. Or, it can measure only one single input terminal signal, if necessary. Except during active mode or calibration mode, the SCSM stays in standby mode to minimize power consumption. During standby mode, only a part of power management unit (PMU) and a watchdog timer are powered up so as to minimize electric current draw. The various control signals described herein can be generated by control unit 407.

Figure 6A:
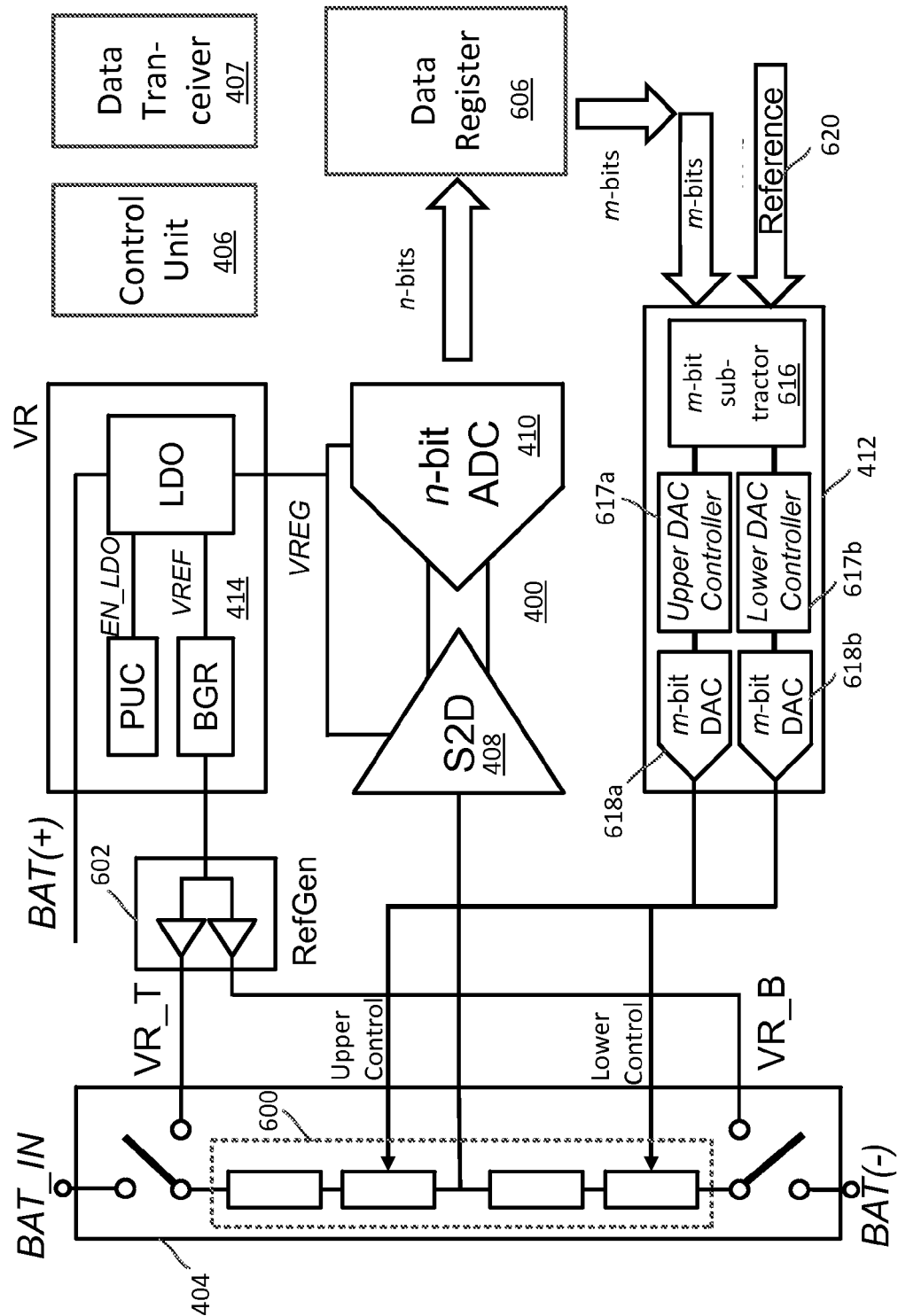
FIG. 6A shows additional details of a single cell sensing architecture of FIG. 4.

Referring now to FIG. 6A, there is shown a second block diagram of SCSM 400 which includes additional components associated with the self-calibration feature. These additional components include an example design of a signal conditioner 404, a reference voltage generator (RefGen) 602, and a data register 606. Also shown in FIG. 6A are certain details of the calibration engine 412, including m-bit subtractor 616, m-bit digital-to-analog converters (DACs) 618a, 618b, and upper/lower DAC controllers 617a, 617b.

The reference voltage generator 602 provides two reference voltages from a stable source, such as a bandgap voltage reference generator. These two reference voltages include a top and bottom reference voltage, which are respectively designated as VR_T and VR_B in FIGS. 4 and 6A. As is known, a bandgap reference generates a constant voltage irrespective of power supply variations, temperature changes and the loading on the device. However, since only the linear terms of current are compensated at bandgap reference, the higher-order terms will limiting the temperature drift of the device to around 20-50 ppm/° C. over a temperature range of 100° C. Besides temperature drift, initial accuracy and drift due to aging must always be trimmed over the operating temperature range and expected lifetime of the device.

The built-in self-calibration consists of two functions, detection and correction. The detection function is performed by measuring the output voltage of a voltage divider 600 while the voltage divider is connected with reference voltages, VR_T and VR_B. The output of the voltage divider is converted to digital data and compared with an ideal reference voltage value 620 in the digital domain. The discrepancy between the measured code and the ideal code in each case is stored at an m-bit calibration register within the calibration engine 412. The length of the calibration register can be determined by the anticipated magnitude of any mismatches. The most significant bit (MSB) of the calibration register can be used to represent the sign of mismatch, either over or under the ideal reference voltage. Accordingly the magnitude of the drift voltage can be represented by a digital data word comprised of m−1 bits.

The DACs 618a, 618b together comprise a dual-channel calibration DAC (CalDAC). Each DAC 618a, 618b is an m−1 bit DAC with an n-bit resolution. The MSB determines which DAC will be used for calibration, the m−1 bits determine the amount or magnitude of the error to be corrected. The correction process measures relative cell voltage with respect to the reference voltages. Therefore, the absolute accuracy of the reference voltages is not as important, although noise and short-term stability may still be important.

Figure 6B:
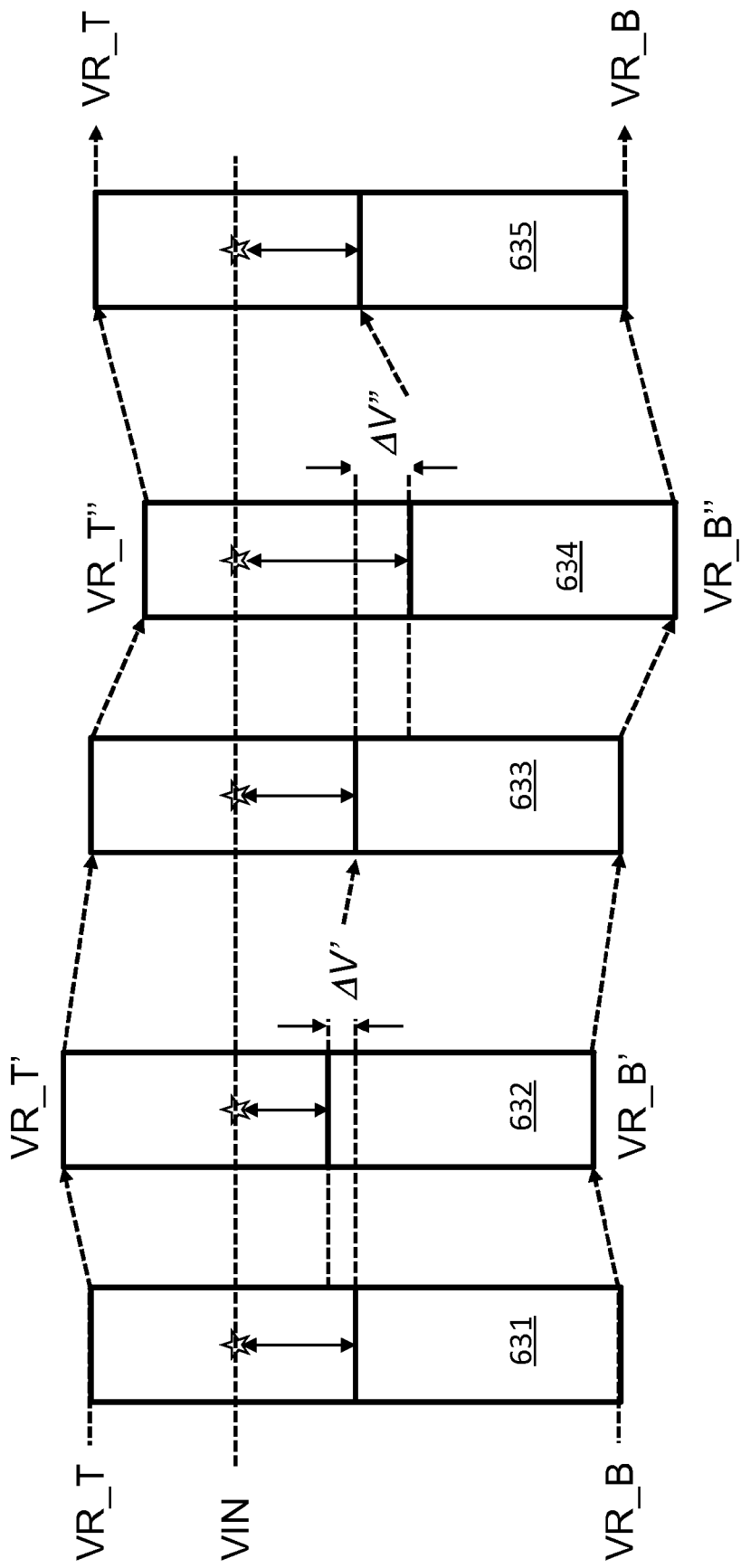
FIG. 6B is a diagram which is useful for understanding a voltage calibration scheme.

FIG. 6B illustrates the concept of reference voltage calibration process when measuring an input voltage VIN. The reference voltages of the ADC define its full-scale input range (refer to case 631). The drift of the reference voltages can cause significant degradation of the conversion accuracy. If the reference voltages drift either higher or lower than the ideal levels defined for these reference values, then the output voltage of the voltage divider 600 also drifts with the same amount of error. For example, if the reference voltages drift higher (as shown in case 632 with non-ideal reference values VR_T'/VR_B'), then the output voltage of the voltage divider 600 also drifts higher with the same amount of error ΔV'. Conversely, if the reference voltages drift lower (as shown in case 634 with non-ideal reference voltages VR_T"/VR_B") then the output voltage of a voltage divider also drifts with the same amount of error ΔV".

The drift error, ΔV' or ΔV", can be determined by subtracting from an n-bit reference code 620 in the digital domain. The correction process can be performed in either the analog or digital domain. In an analog correction scheme, the magnitude of a drift error is interpreted to change of the resistance ratio of a voltage divider 600, either by changing the resistance or the current in a voltage divider. After the completion of this part of the calibration process, the battery input can be read with an accurately calibrated value (refer to case 633 or 635). Thereafter, the correction of reference voltages, VR_T and VR_B, is performed by adding or subtracting the same amount of the error voltage, ΔV' or ΔV", at the reference voltage generator 602 to sustain a constant full-scale range of the ADC.

As noted above, a digital correction scheme can also be used to correct the drift error. In a digital correction scheme, the amount of drift error at the output of a voltage divider can be calculated and stored in an offset register. The correction of the reference voltages is performed to sustain the full-scale range of the ADC and to fix the slope of the ADC transfer function (gain error correction).

To guarantee accurate cell-level current measurement, a new current measurement technique is proposed. The conventional approaches employed for measuring the battery pack current involve using Hall effect sensors or isolated shunt current sensors at the first or end point of a battery pack connection, as shown in FIG. 1. The Hall-effect sensor technology is popular and accurate, but is bulky and has relatively high cost. Accordingly, such technology is not considered well suited for current sensing at the level of an individual battery cell. Moreover, existing shunt resistance current measurement techniques involve the use of shunt resistor components placed in series with each battery cell. The addition of such resistance in the current path increases overall resistance of the battery cell, and therefore reduces efficiency. The adverse effects upon efficiency become particularly problematic in battery packs containing large numbers of battery cells because each of the shunt resistors generate heat and waste energy. The present invention overcomes these problems associated with conventional shunt current sensors by using the inherent resistant of the conductive output terminals of the battery cell as the shunt resistor. With such an approach, no extraneous resistance is added to the circuit, but a high degree of measurement accuracy is required since the resistance associated with the conductive output terminal is very small, usually on the order of about 20 micro-ohms.

Figure 7:
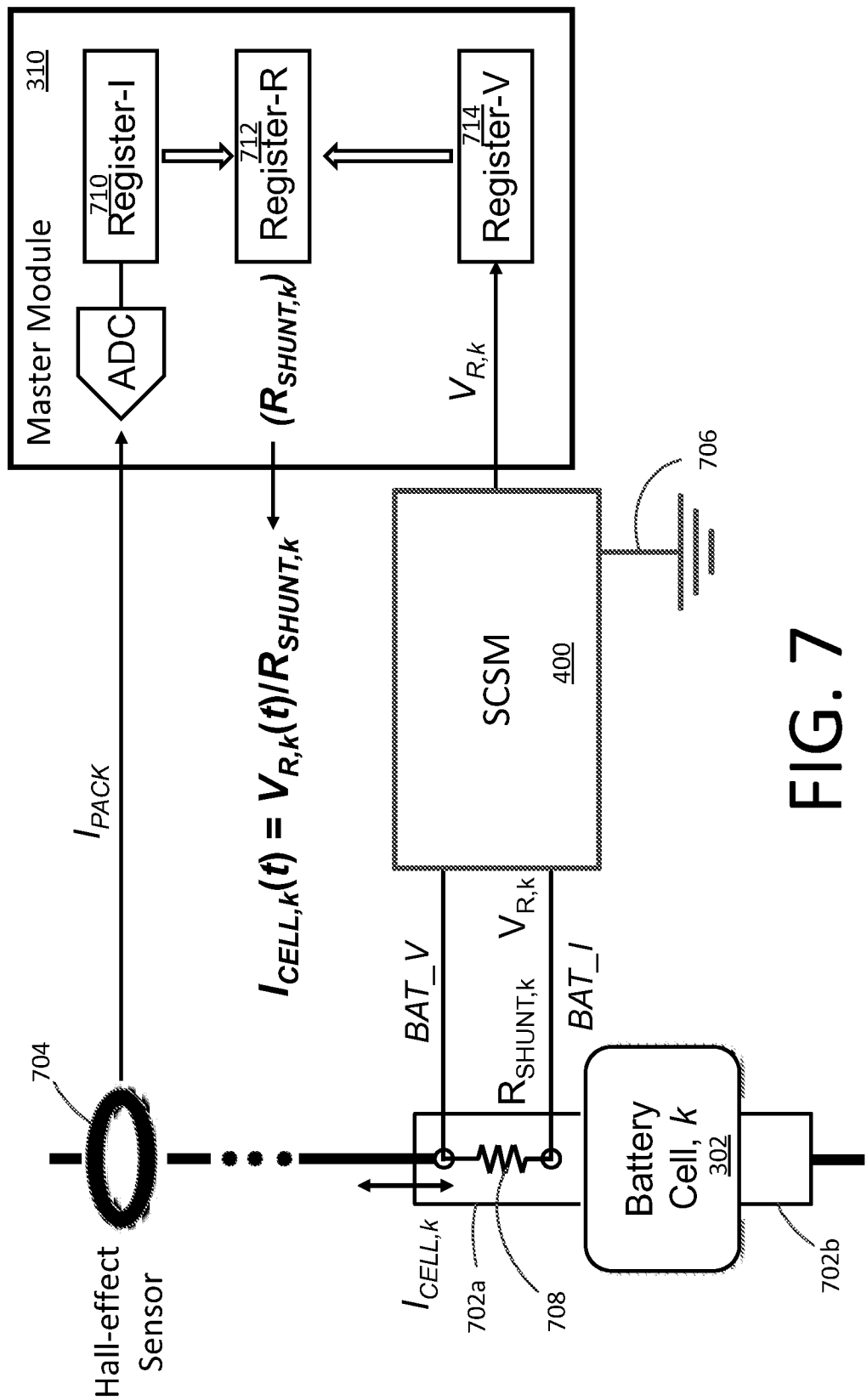
FIG. 7 is a block diagram of a cell-level current sensor architecture that is useful for understanding the invention.

Referring now to FIG. 7, there is shown a conceptual block diagram that is useful for understanding the cell-level current measurement. For convenience, there is shown an exemplary battery cell 302, which is one of k battery cells comprising battery pack 306. For purposes of clarity, only a single battery cell 302 of the battery pack and its associated SCSM 400 are shown. However, it should be understood that the each battery cell 302 in a battery pack 306 can be independently measured in a similar manner with its own SCSM.

When the SCSM 400 is used to measure the voltage of a battery cell 302, it requires only a conductive lead BAT_V which allows a voltage measurement relative to a reference level or ground potential 706. However, when the SCSM 400 is used to measure battery cell current $I_{CELL,\ k}$, of a single battery cell, the SCSM must determine a voltage drop across a shunt resistance. Accordingly, a second test lead BAT_I is provided so that the voltage potential across the shunt resistance 708 resistor can be measured.

To determine single battery cell current, the SCSM 400 measures a voltage across two conductive pads spaced apart a distance on one of the output terminals 702a, 702b of the battery cell 302. Although the output terminals of the battery cell 302 are formed of a conductive metal (e.g. aluminum) they will have some inherent level of resistance along their length. This inherent resistance 708, which is on the order of micro-ohms, will produce a very small but measurable voltage drop $V_{R,\ k}$ across the shunt resistance 708 when measured between the two conductive pads. For convenience, the shunt resistance 708 between the two pads is sometimes referred to herein as $R_{SHUNT,\ k}$. An SCSM 400 is provided for each battery cell 302 within the battery pack 306 so that the voltage $V_{R,\ k}$ can be measured for each of the k battery cells in the pack. These values can be stored in a data memory 714, which is sometimes referred to herein as Register-V.

For purposes of the present invention, an accurate current measurement mainly depends on the accuracy of determining the shunt resistance and the uniformity of such determination over different battery cells 302. Accordingly, the process described herein mainly involves a process for accurately determining a shunt resistance $R_{SHUNT,\ k}$ of each battery cell.

After a battery pack 306 is assembled, an initial pack current ($I_{PACK}$) is precisely measured by using the current sensing device 704. In FIG. 7, the master module 310 receives data concerning the total initial pack current $I_{PACK}$ for battery pack 306 from a current sensing device 704, which may be a Hall-effect sensor. The data received at the master module 310 is stored in a suitable memory device 710, which is sometimes referred to herein as Register-I. Concurrently, an SCSM for each battery cell 302 measures the voltage across the shunt resistor ($V_{R,k}$). This voltage value is communicated to the master module 310 as shown. Thereafter, the effective shunt resistance $R_{SHUNT,k}$ of each battery cell 302 is extracted by dividing $V_{R,k}$ for each cell by the measured value of $I_{PACK}/P$ (where P is the number of cells connected in parallel within each module. In such a scenario, $I_{PACK}/P$ represents the theoretical value of current flow through each battery cell in a module 304, assuming that each battery cell (at least when first assembled as part of the battery pack) passes the same amount of current.

Once the value of $R_{SHUNT,k}$ has been determined for each battery cell 302, it is stored in a digital data memory device 712, which is sometimes referred to herein as Register-R. At this point the master module 310 can begin monitoring the cell current of each individual battery cell 302 as the battery pack is used. In particular, once the $R_{SHUNT,k}$ for all the battery cells 302 are extracted, the respective values are utilized to derive the $I_{CELL,k}$ (t) for each of the battery cells. This is accomplished by dividing $V_{R,k}$ (t) by $R_{SHUNT,k}$, where the $I_{CELL,k}$ (t) and $V_{R,k}$ (t) are values which are periodically obtained over time once the battery pack has been put into service. Over the life of the battery pack, the value of $I_{CELL,k}$ (t) can be monitored by the master module 310 to determine if the value falls outside of certain predetermined limits. The master module can also generate a suitable notification (e.g. a notification to a user) if one or more battery cells are determined to have values that fall outside the predetermined limits. In some scenarios, such notification can include a specific battery cell that is determined to be experiencing current values falling outside predetermined limits.

Figure 8:
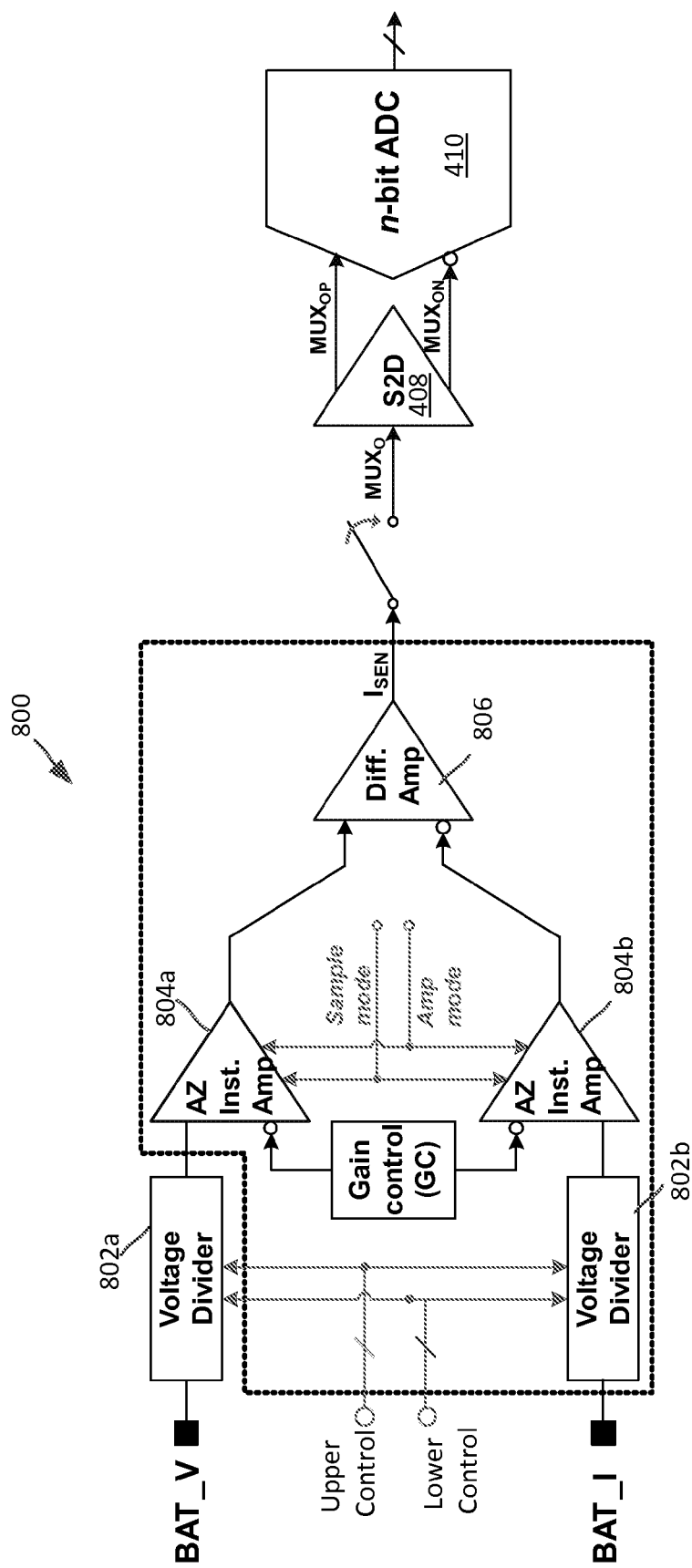
FIG. 8 is a block diagram of a battery cell current measurement block that is useful for understanding the invention.

FIG. 8 illustrates an exemplary architecture of a sensing circuit 800 which can be integrated in each SCSM 400 for purposes of facilitating current sensing. The sensing circuit 800 includes two voltage dividers 802a, 802b which are connected to the conductive leads for BAT_V and BAT_I as described with reference to FIG. 7. In some embodiments, voltage divider 600 can be used for voltage divider 802a. The sensing circuit 800 also includes a pair of auto-zeroed (AZ), programmable-gain instrument amplifiers 804a, 804b and a differential amplifier 806. The voltage across the shunt resistor 708 ($R_{SHUNT,k}$) is delivered to the voltage dividers 802a, 802b and processed to be within a suitable voltage range. The two voltage dividers are selectively calibrated with regard to their voltage division ratios based on the calibration algorithm described with respect to FIGS. 6A and 6B. Upper and lower control signals are provided under the control of the calibration engine 412 to select the voltage division ratios. The upper and lower control signals can be provided from the DACs 618a, 618b for each of the voltage dividers. The instrument amplifiers 804a, 804b linearly amplify the voltage across the shunt resistor 708 with programmable gain settings. The gain can be adjusted by a gain resistance (RG), based on information concerning battery capacity or shunt resistance value. Such gain adjustments can be performed under the supervision of the control unit 406 or other gain control circuitry. The common-mode rejection (CMR) and bandwidth of the amplifier are designed to have reasonable performance. Auto-zeroed amplifiers 804a, 804b are well known in the art and therefore will not be described here in detail. However, it will be appreciated that such amplifiers offer the benefit of low offset voltage and offset voltage drift. The outputs of the auto-zeroed amplifiers are connected to the differential inputs of differential amplifier 806. The output of the differential amplifier 806 is coupled to the S2D which provides the sensed analog voltage to n-bit ADC 410. The ADC provides the output data to a suitable data transceiver so that it can be communicated to a master module 310.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

We claim:

1. A sensing system for a battery pack which includes a multiplicity of battery cells, comprising:
    a multiplicity of single cell sensing modules (SCSM), each SCSM respectively configured to facilitate both a current measurement and a voltage measurement exclusively with respect to one of the multiplicity of battery cells in the battery pack;
    each SCSM comprising
        an analog switching multiplex;
        an analog-to-digital converter (ADC);
        a signal conditioner which conditions an input signal received at the analog switching multiplex and communicates the input signal after conditioning to the ADC;
        a reference voltage generator which generates a plurality of reference voltages; and
        a calibration engine which is configured to use the plurality reference voltages to improve a measurement accuracy with respect to the input signal;
    wherein each SCSM is configured to facilitate the current measurement of a particular battery cell by determining a voltage drop between first and second locations spaced apart a predetermined distance along an output terminal of the battery cell.

2. The sensing system according to claim 1, wherein the calibration engine is configured to determine a drift error.

3. The sensing system according to claim 2, wherein the reference voltage generator generates top and bottom reference voltages which define the full-scale input range for the ADC.

4. The sensing system according to claim 3, wherein the top and bottom reference voltages are applied to inputs of the signal conditioner in a calibration condition to generate an output calibration voltage, and the calibration engine is configured to determine the drift error value by calculating a difference between a predetermined reference value and a measured value output of the ADC in the calibration condition.

5. The sensing system according to claim 4, wherein the signal conditioner includes a voltage divider and the calibration engine is configured to automatically use the drift error value to adjust the voltage divider.

6. The sensing system according to claim 5, wherein the calibration engine is configured to automatically adjust the top reference voltage and the bottom reference voltage based on the drift error value which has been determined.

7. The sensing system according to claim 1, wherein the analog switching multiplex is configured to select when in a sensing mode one or more of a plurality of the input signals from the particular battery cell and wherein the input signals is selected from the group consisting of a voltage sense signal and a current sense signal.

8. The sensing system according to claim 7, wherein the analog switching multiplex is further configured to select as the input signal a temperature sensor signal associated with the particular battery cell.

9. The sensing system according to claim 1, wherein the SCSM is configured to measure the voltage drop as caused by an inherent resistance of a portion of the output terminal.

10. The sensing system according to claim 9, wherein the signal conditioner includes two voltage conditioners which respectively independently condition an input voltage potential at each of the first and second locations.

11. The sensing system according to claim 10, further comprising a master controller which receives from each of the SCSM a value which specifies the voltage drop for each of the battery cells.

12. The sensing system according to claim 11, wherein the master controller is configured to calculate a shunt resistance value associated with each single battery cell using the value which specifies the voltage for each battery cell and based on a total battery pack current measured at a time when the battery pack is first assembled.

13. The sensing system according to claim 12, wherein the master controller is configured to determine an individual battery cell current for each of the battery cells by using the shunt resistance value and the voltage drop for each battery cell as measured at each of the SCSM.

14. The sensing system according to claim 13, wherein the master controller automatically determines a condition of each battery cell based on the battery cell current for each battery.

15. The sensing system according to claim 12, wherein the total battery pack current is determined using a Hall-effect sensor at a battery pack output terminal.

16. A sensing system for a battery pack which includes a multiplicity of battery cells, comprising:
  a multiplicity of single cell sensing modules (SCSM), each SCSM respectively configured to facilitate both a current measurement and a voltage measurement exclusively with respect to one of the multiplicity of battery cells in the battery pack;
  each SCSM comprising a calibration engine configured to reduce measurement errors; and
  wherein each SCSM is configured to facilitate the current measurement of a particular battery cell by determining a voltage drop between first and second locations spaced apart a predetermined distance along an output terminal of the battery cell.

17. A method for determining battery cell current and battery cell voltage for a multiplicity of battery cells associated with a battery pack, comprising:
  providing a multiplicity of single cell sensing modules (SCSM) respectively for monitoring a multiplicity of battery cells in the battery pack;
  exclusively using each of the multiplicity of SCSM to respectively facilitate both a current measurement and a voltage measurement for a corresponding one the multiplicity of battery cells;
  for each of the battery cells, facilitating the current measurement by precisely determining a voltage drop between first and second locations spaced apart a predetermined distance along an output terminal of the battery cell.

18. The method according to claim 17, further comprising performing at least one calibration operation to facilitate the precise determination of the voltage drop.

19. The method according to claim 17, further comprising determining for each battery cell a resistance value associated with the electrical path between the first and second locations.

20. The method according to claim 19, further comprising determining the resistance value for each cell at a time when the battery pack is first assembled.

21. The method according to claim 19, further comprising using the resistance value which has been determined for each battery cell, and the voltage drop which is measured during a battery management session, to calculate the battery cell current.

22. A sensing system for a battery pack which includes a multiplicity of battery cells, comprising:
  a multiplicity of single cell sensing modules (SCSM) respectively provided for the multiplicity of battery cells, each SCSM in communication with a master control module;
  each SCSM respectively configured to facilitate both a voltage measurement and a current measurement exclusively with respect to one battery cell of the multiplicity of battery cells in the battery pack; and
  a data transceiver to facilitate communications with the master control module;
  wherein each SCSM is configured to facilitate the current measurement of a particular battery cell by determining a voltage drop between first and second locations spaced apart a predetermined distance along an output terminal of the battery cell.

* * * * *